(12) United States Patent
Lee

(10) Patent No.: US 7,569,495 B2
(45) Date of Patent: Aug. 4, 2009

(54) SEMICONDUCTOR DEVICES AND METHODS OF MANUFACTURING THE SAME

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 240 days.

(21) Appl. No.: 11/158,465

(22) Filed: Jun. 22, 2005

(65) Prior Publication Data

US 2005/0280123 A1 Dec. 22, 2005

(30) Foreign Application Priority Data

Jun. 22, 2004 (KR) .................. 10-2004-0046496

(51) Int. Cl.
 *H01L 21/31* (2006.01)
 *H01L 21/469* (2006.01)
(52) U.S. Cl. ............... 438/763; 438/786; 257/E21.267; 257/637
(58) Field of Classification Search .......... 257/E21.149, 257/E29.128, E29.117, E29.132, E29.157, 257/E29.165
See application file for complete search history.

(56) References Cited

U.S. PATENT DOCUMENTS 5,877,514 A * 3/1999 Seo ............................ 257/72
6,287,951 B1 * 9/2001 Lucas et al. ................. 438/618
6,372,569 B1 * 4/2002 Lee et al. .................... 438/229
2002/0192885 A1 * 12/2002 Miyasaka ................... 438/164
2004/0121571 A1 * 6/2004 Uchikoshi et al. ........... 438/586

OTHER PUBLICATIONS

Schulze, Hans-Joachim et al., Passivation Layer for Power Semiconductors with PN junctions appearing on the surface, Jul. 17, 1998, PCT/DE99/01924.*

* cited by examiner

*Primary Examiner*—W. David Coleman
*Assistant Examiner*—Sonya D McCall-Shepard
(74) *Attorney, Agent, or Firm*—The Law Offices of Andrew D. Fortney; Andrew D. Fortney

(57) ABSTRACT

Semiconductor devices and methods of manufacturing the same are disclosed. In a disclosed method, a dangling bond in the active region(s) is removed by providing an enough $H_2$ in the PMD liner layer and the interlayer insulating layer directly contacting the active regions, and then gradually diffusing the $H_2$ in a subsequent heat treatment. The method includes forming a gate electrode having a side wall spacer, forming source and drain regions, forming a PMD liner layer by sequentially forming a $SiO_2$:H layer, a SiON:H layer and a SiN:H layer above the gate electrode and the source and drain regions, forming an interlayer insulating layer above the PMD liner layer, and diffusing hydrogen in the PMD liner layer and the interlayer insulating layer to the source and drain region by $N_2$ annealing or Ar annealing.

14 Claims, 2 Drawing Sheets

SEMICONDUCTOR DEVICES AND METHODS OF MANUFACTURING THE SAME

FIELD OF THE DISCLOSURE

The present disclosure relates generally to semiconductor fabrication, and, more particularly, to semiconductor devices and methods of manufacturing the same.

BACKGROUND

In the semiconductor manufacturing process, a pre-metal dielectric (PMD) liner layer is formed in order to prevent diffusion of the boron (B) and phosphorus (P) existing in the borophosphosilicate glass (BPSG), boron-silicate glass (BSG), and/or phosphorus silicate glass (PSG), etc., which are mainly used to protect an active area such as a source region and a drain region, and used as a PMD layer.

When a dangling bond exists on a surface of the active area of an image sensor, leakage current may be caused in the image sensor (e.g., in a photodiode which converts the light coming from the micro lens formed by photoresist to an electrical signal). In this case, the dangling bond can be removed by applying $H_2$ annealing to the active area.

However, when an excessive amount of the $H_2$ directly contacts the active area, the characteristics of the semiconductor device may be deteriorated.

On the other hand, when the $H_2$ annealing is performed after the fabrication of the metal line, the $H_2$ annealing becomes far less effective due to a substantial decrease in a probability of the $H_2$ diffusion.

Figure 1:
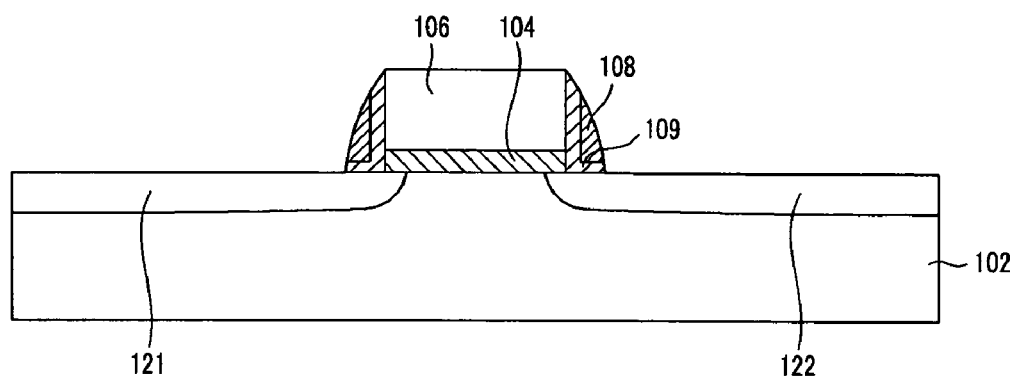
FIG. 1 to FIG. 3 are cross-sectional views illustrating sequential stages of an example method for manufacturing a semiconductor device performed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 2:
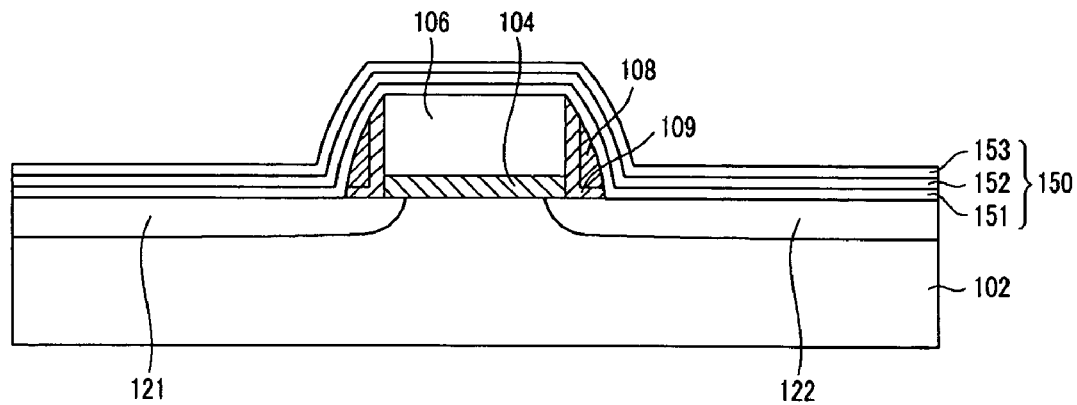
Figure 3:
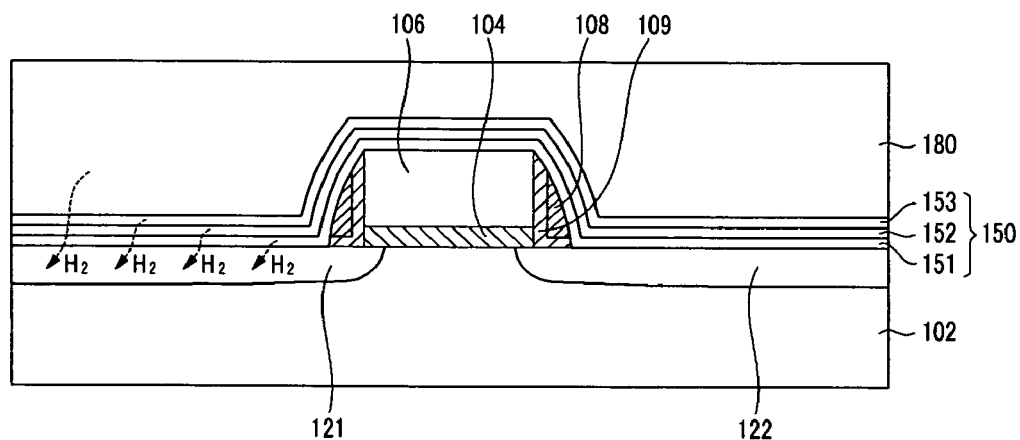

FIG. 1 to FIG. 3 are cross-sectional views illustrating sequential stages of an example method for manufacturing a semiconductor device performed in accordance with the teachings of the present invention.

As shown in FIG. 3, an example semiconductor device constructed in accordance with the teachings of the present invention includes a gate electrode 106 and source and drain regions 121 and 122 on a semiconductor substrate 102. It also includes a PMD liner layer 150 on the gate electrode 106 and the source and drain regions 121 and 122.

The PMD liner layer 150 of the example of FIG. 3 includes an $SiO_2$:H layer 151, an SiON:H layer 152, and an SiN:H layer 153. The SiON:H layer 152 is formed with a thickness of about 200 Å, and the $SiO_2$:H layer 151 and the SiN:H layer 153 are respectively formed with a thickness of about 100 Å to about 200 Å.

In the example of FIG. 3, an interlayer insulating layer 180 is formed on the PMD liner layer 150 as an $SiO_2$:H layer doped with N, P, As, or Sb.

Therefore, since a sufficient amount of hydrogen is contained in the interlayer insulating layer 180 and the PMD liner layer 150 directly contacting the active regions 121 and 122, a dangling bond may be removed by diffusing $H_2$ in a subsequent heat treatment:

An example method for manufacturing a semiconductor device will now be described with reference to FIGS. 1-3. As shown in FIG. 1, after an oxide layer for forming a gate insulating layer 104 and a polysilicon layer for forming a gate electrode 106 are sequentially formed on the semiconductor substrate 102, the polysilicon layer and the oxide layer are patterned by a photolithography process to form a gate insulating layer 104 and the gate electrode 106. Then, a side wall spacer 108 having an oxide layer 109 and a nitride layer is formed on the exposed side walls of the gate electrode 106 and the gate insulating layer 104.

Subsequently, a source and a drain of the semiconductor device are formed by implanting impurities of high or low concentration into the source and drain regions 121 and 122 of the semiconductor substrate 102, (e.g., by implanting the impurities using an ion implantation mask).

After HF cleaning the semiconductor substrate 102, the $SiO_2$:H layer 151 is formed on the gate electrode 106 and the source and drain regions 121 and 122 of the semiconductor substrate 102 in a thickness of about 100-200 Å, as shown in FIG. 2. In the illustrated example, the $SiO_2$:H layer 151 is formed by a PECVD method employing a plasma of $SiH_4$, $O_2$, $H_2$, and He, so as to have a high density of $H_2$.

The $SiO_2$:H layer 151 having a high density of $H_2$ can provide $H_2$ to the source and drain regions in a subsequent annealing process.

That is, a conventional $SiO_2$:H layer is formed by using a plasma of $SiH_4$, $O_2$, and Ar. However, in an example, the $SiO_2$:H layer 151 is formed by using a plasma of $SiH_4$, $O_2$, $H_2$, and He, and accordingly a density of $H_2$ therein is increased.

In addition, the $SiO_2$:H layer 151 buffers the high stress of the SiN:H layer 153 that is subsequently formed.

In the illustrated example, the SiON:H layer 152 is formed with a thickness of about 50 Å to about 200 Å on the $SiO_2$:H layer 151 by using a plasma of $SiH_4$, $N_2O$, $NH_3$, and He, in the same deposition apparatus.

Since the SiON:H layer 152 has surplus $H_2$, it provides a stress buffer effect between the $SiO_2$:H layer 151 and the SiN:H layer 153.

The PMD liner layer 150 is then completed in the same deposition apparatus by forming the SiN:H layer 153 on the SiON:H layer 152, with a thickness of about 100 Å to about 200 Å by using a plasma of $SiH_4$, $NH_3$, and Ar.

In the illustrated process, the PMD liner layer is formed of the $SiO_2$:H layer 151, the SiON:H layer 152, and the SiN:H layer 153, which is different from a simple nitride layer.

Next, as shown in FIG. 3, an interlayer insulating layer 180 of a poly-metal dielectric layer is formed on the PMD liner layer 150 by the high density plasma (HDP) method employing a plasma of $SiH_4$, N, P, As, a hydride of Sb or Bi, and $H_2$.

Since such an interlayer insulating layer 180 includes a group V element, the gathering effect is large. Because of the $H_2$ plasma, the interlayer insulating layer 180 contains enough $H_2$ to be diffused to the source and drain regions 121 and 122 in the subsequent process.

When $N_2$ annealing or Ar annealing is performed before or after forming a protective layer through a general semiconductor process, $H_2$ contained in the PMD liner layer 150 and the interlayer insulating layer 180 is diffused to the surface of the source and drain regions 121 and 122, and accordingly the dangling bond is removed.

Figure 4:
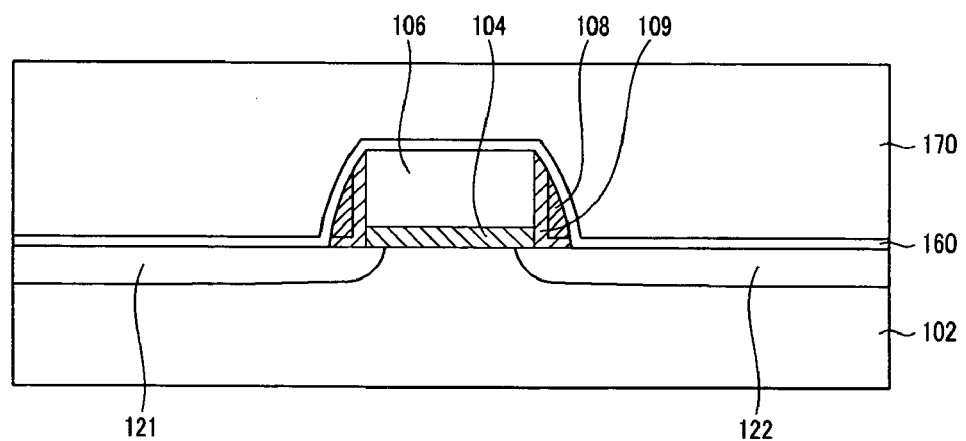
FIG. 4 is a cross-sectional view of a prior art semiconductor device manufactured by a prior art method.

FIG. 4 is a cross-sectional view of a prior art semiconductor device manufactured by a prior art method.

As shown in FIG. 4, after an oxide layer for forming a gate insulating layer 104 and a polysilicon layer for forming a gate electrode 106 are sequentially formed on the semiconductor substrate, the polysilicon layer and the oxide layer are patterned by a photolithography process to form the gate insulating layer 104 and the gate electrode 106. Then, a side wall spacer 108 having an oxide layer 109 and a nitride layer is formed on the exposed side walls of the gate electrode 106 and the gate insulating layer 104.

Subsequently, a source and a drain of the semiconductor device are formed by implanting impurities of high or low concentration into the source and drain regions 121 and 122 of the semiconductor substrate 102, (e.g., by implanting the impurities using an ion implantation mask). Then, a PMD liner layer 160 is deposited to have a thickness of 200 Å to 500 Å. Then, a borophosphosilicate glass (BPSG) is deposited on the PMD liner layer 160 by an $O_3$-TEOS CVD method or a phosphorus silicate glass (PSG) is deposited by the HDP method. Next, a chemical mechanical polishing (CMP) process is performed to planarize it.

When $H_2$ annealing is subsequently performed, a diffusion probability of the $H_2$ decreases. Therefore the diffusion becomes far less effective, and the leakage current phenomenon caused by the dangling bond is not removed.

Therefore, in the example discussed above in connection with FIGS. 1-3, the dangling bond in the active regions 121 and 122 is removed by providing an enough $H_2$ in the PMD liner layer 160 and the interlayer insulating layer 170 directly contacting the active regions 121 and 122, and then gradually diffusing the $H_2$ in a subsequent heat treatment.

The above described example semiconductor device and method of manufacturing the same provides advantages with respect to dangling bond(s) in the active regions by providing an enough $H_2$ in the PMD liner layer and the interlayer insulating layer directly contacting the active regions, and then gradually diffusing the $H_2$ in a subsequent heat treatment.

Therefore, the problem of leakage current in a semiconductor device like an image sensor having a substantial amount of dangling bonds in the active region can be solved.

From the foregoing, persons of ordinary skill in the art will readily appreciate that semiconductor devices and methods of manufacturing semiconductor devices have been provided which have the advantages of removing dangling bond(s) in the active region(s) by providing enough $H_2$ in the PMD liner layer and the interlayer insulating layer directly contacting the active regions, and then gradually diffusing the $H_2$ in a subsequent heat treatment.

An example method for manufacturing a semiconductor device includes forming a gate electrode having a side wall spacer and a source and drain region on a semiconductor substrate, forming a PMD liner layer by sequentially forming a $SiO_2$:H layer, a SiON:H layer and a SiN:H layer on the gate electrode and the source and drain regions, forming an interlayer insulating layer on the PMD liner layer, and diffusing hydrogen in the PMD liner layer and the interlayer insulating layer to the source and drain regions by $N_2$ annealing or Ar annealing.

In some examples, the $SiO_2$:H layer is formed by using a plasma of $SiH_4$, $O_2$, $H_2$, and He.

In some examples, the SiON:H layer is formed by using a plasma of $SiH_4$, $N_2O$, $NH_3$, and He.

In some examples, the $SiO_2$:H layer, the SiON:H layer, and the SiN:H layer are formed by the same deposition apparatus.

In some examples, the interlayer insulating layer is formed by using a plasma of $SiH_4$, N, P, As, a hydride of Sb or Bi, and $H_2$.

In some examples, the SiON:H layer is formed with a thickness of about 50 Å to about 200 Å.

In some examples, the $SiO_2$:H layer and the SiN:H layer are formed with a thickness of about 100 Å to about 200 Å.

In some examples, the interlayer insulating layer is formed by an HDP method.

An disclosed example semiconductor device includes a gate electrode and source and drain regions on a semiconductor substrate, a PMD liner layer on the gate electrode and the source and drain regions, and an interlayer insulating layer on the PMD liner layer and formed of an $SiO_2$:H layer doped with N, P, As, Sb, or Bi, wherein the PMD liner layer is sequentially formed with the $SiO_2$:H layer, an SiON:H layer, and an SiN:H layer.

In some examples, the SiON:H layer has a thickness of about 50 Å to about 200 Å. In some examples, the $SiO_2$:H layer and SiN:H layer have a thickness of about 100 Å to about 200 Å.

It is noted that this patent claims priority from Korean Patent Application Serial Number 10-2004-0046496, which was filed on Jun. 22, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for manufacturing a semiconductor device comprising:

forming a gate electrode on a semiconductor substrate, the gate electrode comprising a patterned polysilicon layer and having a side wall spacer on a sidewall thereof;

forming source and drain regions in the semiconductor substrate using the gate electrode and the side wall spacer as a mask;

forming a PMD liner layer on the gate electrode by sequentially forming a first $SiO_2$:H layer, a SiON:H layer having a thickness of 50 Å to 200 Å using a plasma of $SiH_4$, $N_2O$, $NH_3$, and He, and a SiN:H layer using a same deposition apparatus as the first $SiO_2$:H layer and the SiON:H layer, wherein the PMD liner layer directly contacts the gate electrode and the source and drain regions;

forming an interlayer insulating layer above the PMD liner layer by an HDP method employing a plasma of $SiH_4$, $H_2$, and at least one of N, P, As, and a hydride of Sb or Bi; and removing dangling bonds in the source and drain regions by diffusing hydrogen in the PMD liner layer and the insulating layer to the source and drain regions by $N_2$ annealing or Ar annealing.

2. A method as defined in claim 1, wherein the first $SiO_2$:H layer is formed using a plasma of $SiH_4$, $O_2$, $H_2$, and He.

3. A method as defined in claim 1, wherein the SiN:H layer is formed using a plasma of $SiH_4$, $NH_3$, and Ar.

4. A method as defined in claim 1, wherein the first $SiO_2$:H layer and the SiN:H layer have a thickness of 100 Å to 200 Å.

5. A method as defined in claim 1, wherein the PMD liner layer has a thickness of 200 Å to 500 Å.

6. A method as defined in claim 4, wherein the PMD liner layer has a thickness of 200 Å to 500 Å.

7. A method as defined in claim 1, further comprising forming a protective layer before $N_2$ annealing or Ar annealing.

8. A method as defined in claim 1, further comprising forming a protective layer after $N_2$ annealing or Ar annealing.

9. A method as defined in claim 1, wherein the insulating layer comprises a second $SiO_2$:H layer.

10. A method as defined in claim 4, wherein the insulating layer comprises a second $SiO_2$:H layer.

11. A method as defined in claim 5, wherein the insulating layer comprises a second $SiO_2$:H layer.

12. A method as defined in claim 9, wherein the second $SiO_2$:H layer comprises at least one of N, P, As or Sb.

13. A method as defined in claim 10, wherein the second $SiO_2$:H layer comprises at least one of N, P, As or Sb.

14. A method as defined in claim 11, wherein the second $SiO_2$:H layer comprises at least one of N, P, As or Sb.

* * * * *